United States Patent
Pramanick et al.

(10) Patent No.: US 6,362,526 B1
(45) Date of Patent: Mar. 26, 2002

(54) ALLOY BARRIER LAYERS FOR SEMICONDUCTORS

(75) Inventors: Shekhar Pramanick, Fremont; John A. Iacoponi, San Jose, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/169,277

(22) Filed: Oct. 8, 1998

(51) Int. Cl.$^7$ .................. H01L 23/48; H01L 29/12; H01L 21/44; H01L 21/4763
(52) U.S. Cl. .................. 257/751; 257/767; 257/771; 257/753; 257/740; 257/761; 257/768; 257/915; 438/597; 438/627; 438/653; 438/629; 438/643; 438/648; 438/656; 438/675
(58) Field of Search .................. 257/751, 767, 257/771, 753, 740, 761–764, 768, 915; 438/597, 627, 628, 653, 629, 643, 648, 656, 675

(56) References Cited

U.S. PATENT DOCUMENTS

| | | | | |
|---|---|---|---|---|
| 4,566,026 A | * | 1/1986 | Lee et al. | 357/71 |
| 5,665,639 A | * | 9/1997 | Seppala et al. | 438/15 |
| 5,670,823 A | * | 9/1997 | Kroeger et al. | 257/751 |
| 5,892,281 A | * | 4/1999 | Akram et al. | 257/750 |
| 5,955,785 A | * | 9/1999 | Gardner et al. | 257/751 |
| 5,976,928 A | * | 11/1999 | Kirlin et al. | 438/240 |
| 6,124,201 A | * | 9/2000 | Wang et al. | 438/634 |
| 6,130,161 A | * | 10/2000 | Ashley et al. | 438/687 |
| 6,258,710 B1 | * | 7/2001 | Rathore et al. | 438/628 |

OTHER PUBLICATIONS

Brouillard "Thin Metallurgy with Sandwich Barrier Layers" IBM Technical disclosure Bulltin 21, 576 (Jul. 1978).*

* cited by examiner

Primary Examiner—Carl Whitehead, Jr.
Assistant Examiner—James Mitchell
(74) Attorney, Agent, or Firm—Mikio Ishimaru

(57) ABSTRACT

A semiconductor barrier layer and manufacturing method therefor for copper interconnects which is a tantalum-titanium, tantalum-titanium nitride, tantalum-titanium sandwich. The tantalum in the tantalum-titanium alloy bonds strongly with the semiconductor dielectric, the tantalum-titanium nitride acts as the barrier to prevent diffusion of copper, and the titanium bonds strongly with the copper.

4 Claims, 3 Drawing Sheets

ALLOY BARRIER LAYERS FOR SEMICONDUCTORS

TECHNICAL FIELD

The present invention relates generally to semiconductors and more specifically to barrier metals for preventing diffusion of conductive materials.

BACKGROUND ART

While manufacturing integrated circuits, after the individual devices, such as the transistors, have been fabricated in the silicon substrate, they must be connected together to perform the desired circuit functions. This connection process is generally called "metallization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical-mechanical polishing process leaves the two vertically separated, horizontally perpendicular channels connected by cylindrical vias.

The use of the dual damascene technique eliminates metal etch and dielectric gap fill steps typically used in the metallization process. The elimination of metal etch steps is important as the semiconductor industry moves from aluminum to other metallization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as barrier materials for copper. A thin adhesion layer formed of an adhesion material, such as tantalum (Ta), titanium (Ti), or tungsten (W) is first deposited on the dielectrics or vias to ensure good adhesion and good electrical contact of the subsequently deposited barrier layers to underlying doped regions and/or conductive channels. Adhesion/barrier layer stacks formed of adhesion/barrier materials such Ta/TaN, Ti/TiN, and W/WN have been found to be useful as adhesion/barrier material combination for copper interconnects.

However, even with the various types of barrier layers, copper is still subject to strong electro-migration due to poor surface adhesion to the barrier layers. A solution, which would form a copper conductive channel with better surface adhesion and thus longer electromigration lifetime, has been long sought The difficulty is that many approaches result in an increase in the electrical resistance. As the semiconductor industry is moving from aluminum to copper and other type of materials with greater electrical conductivity and diffusiveness through dielectrics, it is becoming more pressing that a solution be found.

DISCLOSURE OF THE INVENTION

The present invention provides alloy barrier layer for semiconductors and a manufacturing method therefor. The alloy is first disposed on the semiconductor, processed to be infused by a barrier improving material, followed by the alloy being further disposed to complete the barrier before the disposition of the conductive layer.

The present invention provides tantalum-titanium alloy barrier layer for copper conductors in semiconductors and a manufacturing method therefor. The tantalum-titanium alloy is first deposited on the semiconductor dielectric, nitrided, the deposition of the tantalum-titanium alloy is completed and the copper metalization is deposited on the tantalum titanium alloy. The titanium forms a superb bond with the dielectric, the tantalum-titanium nitride forms a superb diffusion barrier, and the titanium forms a superb bond with the copper conductor.

The present invention provides an alloy which provides superb adhesion of the barrier layer with the semiconductor dielectric.

The present invention further provides an alloy having a superb copper diffusion barrier as part of the barrier layer.

The present invention further provides superb adhesion between the alloy and the conductive material while suppressing surface diffusion of the conductive material.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
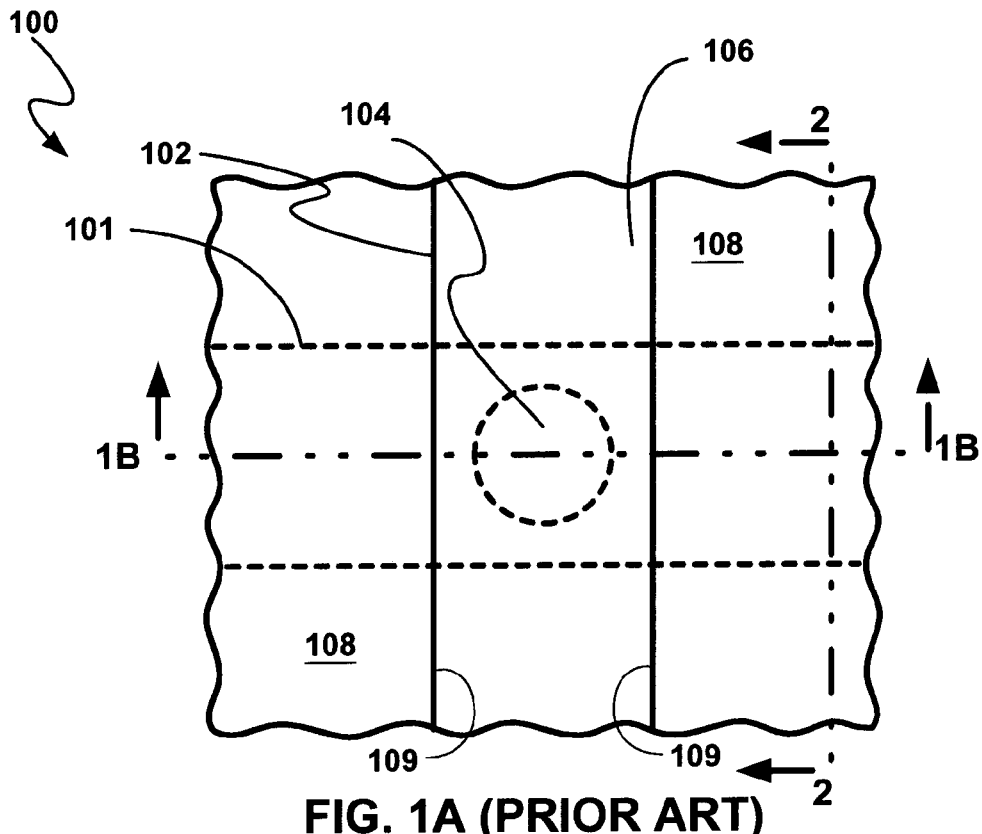
FIG. 1A (PRIOR ART) is a plan view of a semiconductor with aligned channels and a prior art via.

Referring now to FIG. 1A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via opening 104 connects the first and second channels 101 and 102 and is a part of the second channel 102. The first channel 101 comprises a first conductive material. The second channel 102 is formed by filling a second channel opening 106 disposed in a second channel oxide layer 108 (silicon dioxide, $SiO_2$) with a second conductive material. The second channel opening 106 is defined by walls (sidewalls) 109 of second channel oxide layer 108.

Figure 1B:
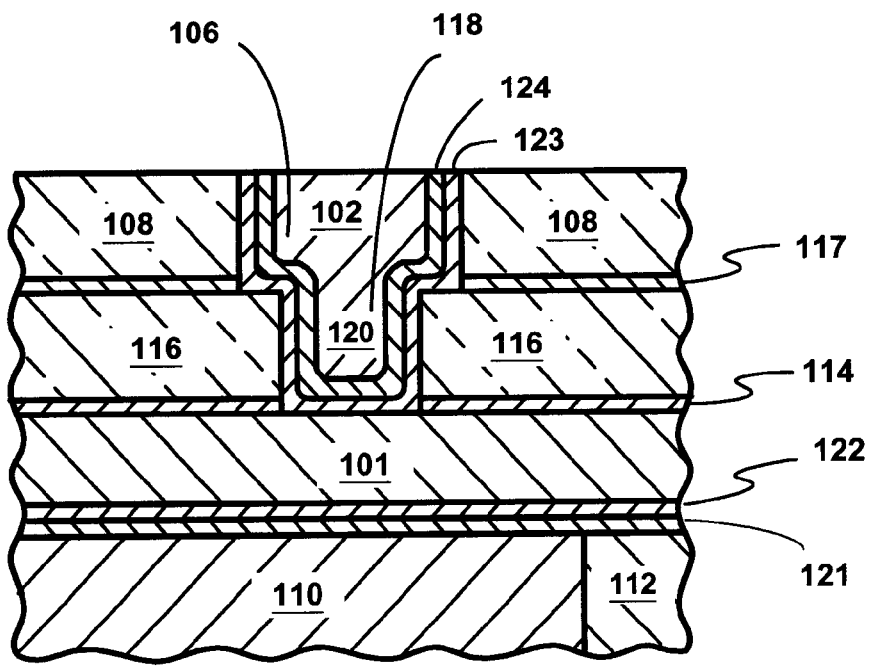
FIG. 1B (PRIOR ART) is a cross-section of FIG. 1A (PRIOR ART) along line 1B—1B.

Referring now to FIG. 1B (PRIOR ART), therein is shown a cross-section of FIG. 1A (PRIOR ART) along 1B—1B. The first channel 101 is disposed over a polysilicon gate 110 and an oxide dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via opening 104 of FIG. 1A (PRIOR ART) defines a cylindrical via 120 in the cylindrical via opening 118 when it is filled with the second conductive material.

Also shown disposed around the first channel 101 are an optional adhesion layer 121 and a barrier layer 122, and around the second channel 102 and the cylindrical via 120 is an optional adhesion layer 123 and barrier layer 124. Barrier layers include barrier materials and, where necessary, are used to prevent diffusion of the conductive materials into the adjacent areas of the semiconductor.

Figure 2:
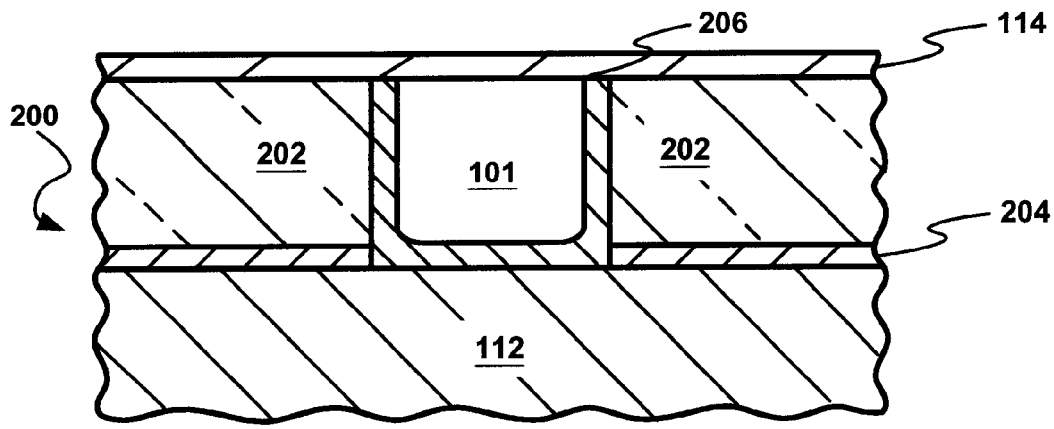
FIG. 2 is a simplified cross-section of a partially processed semiconductor wafer similar to a partial cross-section of FIG. 1A (PRIOR ART) along line 2—2.

Referring now to FIG. 2, therein is shown the cross-section of a semiconductor wafer 200 after completion of the first channel. Strictly for ease of understanding, the completed semiconductor wafer 200 can be understood to be the equivalent of a portion of the semiconductor wafer 100 taken along the line 2—2 in FIG. 1A (PRIOR ART). Thus, the cross-section of FIG. 2 shows the cross-section of the semiconductor wafer 200 after etching to open a channel area in the semiconductor dielectric, or the first channel oxide layer 202, through the first stop nitride layer 204, and down to the oxide dielectric layer 112. The alloy barrier layer 206 of the present invention has been processed and filled with conductive material to form the first channel 101. The wafer 200 has also been subject to chemical-mechanical polishing to level the channel 101 and the barrier layer 206 with the first channel oxide layer 202. The stop nitride layer 114 has been deposited in FIG. 2 in preparation for formation of the round via opening 104 and the second channel 102 (not shown).

Figure 3:
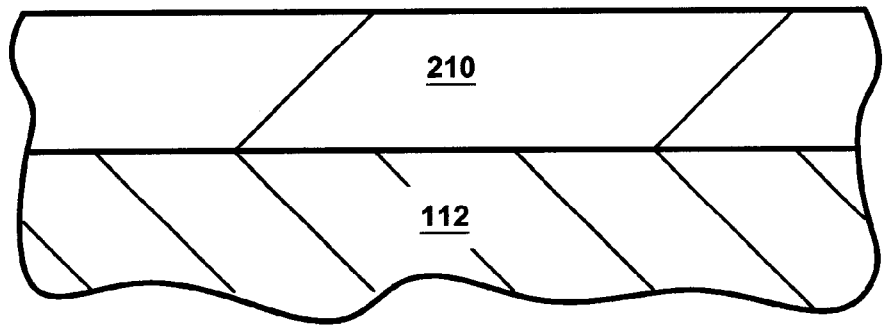
FIG. 3 is a partial close-up cross-section the barrier layer of FIG. 2 after deposition of an alloy.

Referring now to FIG. 3, therein is shown the cross-section of the semiconductor 200 during the initial deposition of the alloy 210. In the best mode, the alloy 210 is of tantalum titanium (Ta-Ti). The alloy 210 is deposited over the oxide dielectric layer 112 to a thickness under 100 angstroms for current copper interconnect technology.

Figure 4:
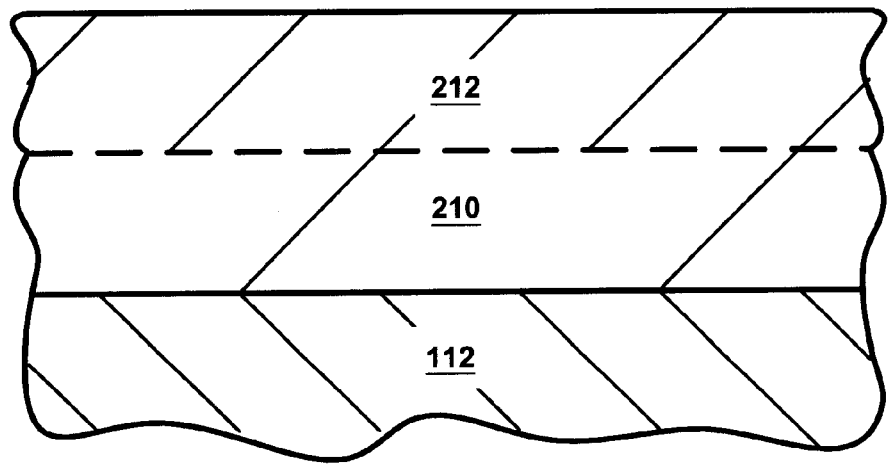
FIG. 4 is FIG. 3 after further deposition of the alloy and nitriding.

Referring now to FIG. 4, therein is shown barrier material 212 disposed over the alloy 210. The barrier material 212 is the nitrided form of the alloy 210 which can either be deposited in a nitrided form or be nitrided in-situ. In the best mode, the Ta—Ti alloy is nitrided and deposited in a nitrogen atmosphere to form tantalum-titanium nitride ($Ta_xTi_yN_z$). In an alternate mode, the Ta—Ti alloy deposition is stopped and the wafer 200 is heated to nitriding temperature in a nitrogen atmosphere oven. Generally, the barrier material 212 thickness would be between 50 angstroms to 200 angstroms for current copper interconnect technology.

Figure 5:
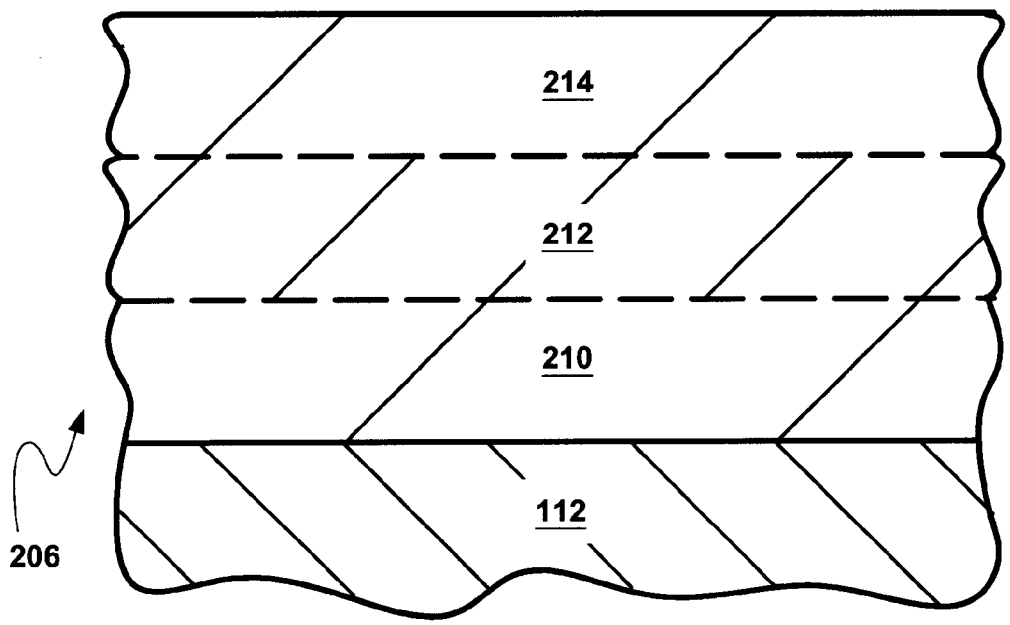
FIG. 5 is FIG. 4 after nitriding and further deposition of the alloy.

Referring now to FIG. 5, therein is shown the continued deposition of the alloy 210 to form an alloy portion or region 214 above the barrier region 212. The alloy region 214 would have a thickness of less than 100 angstroms for current copper interconnect technology. FIG. 5 shows a sandwich arrangement of the oxide dielectric layer 112 with the barrier layer 206 formed of an alloy 1210 with an intermediate barrier material 212 for a built up nitrided portion or region for in-situ nitriding and a further alloy 214.

Figure 6:
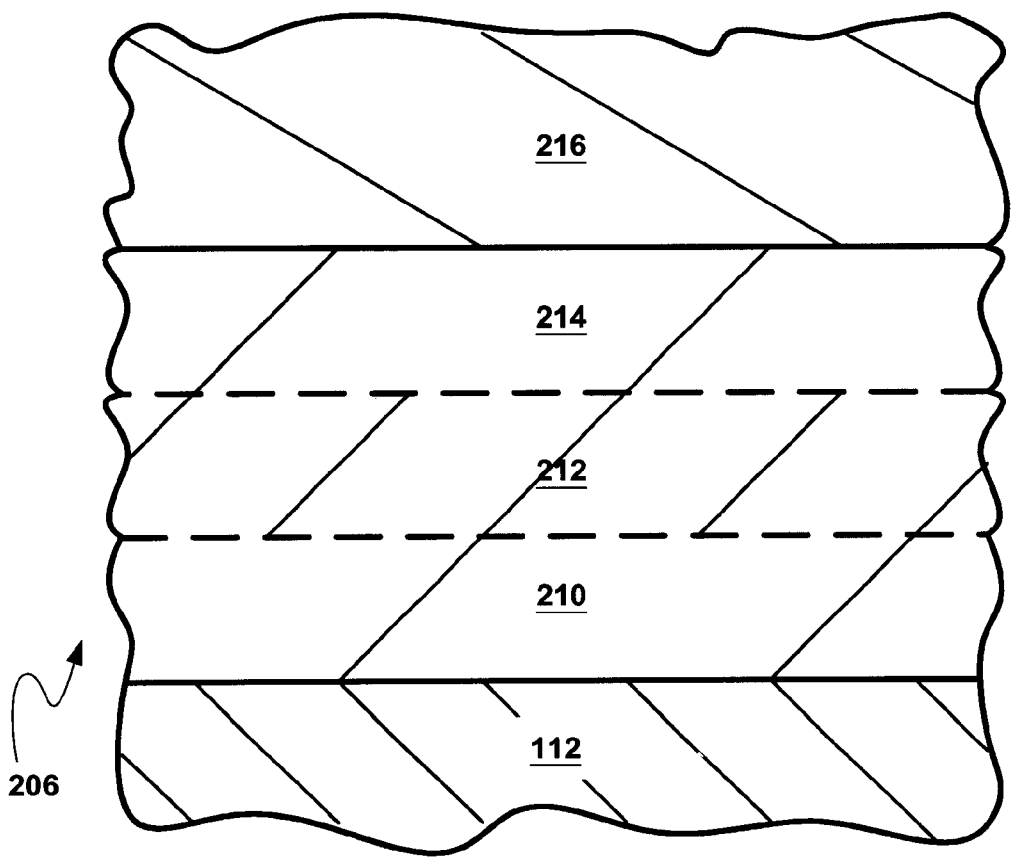
FIG. 6 is FIG. 5 after deposition of the conductive material.

Referring now to FIG. 6, therein is shown FIG. 5 after deposition of a conductive material 216 which forms the channel 101. In the best mode, the conductive material is copper or copper alloy.

In production in the past, a conventional first damascene process was used to put down over a production semiconductor wafer 100 a first channel 101 in a first channel oxide layer (not shown) above portions of a semiconductor device (not shown). The damascene process is a photolithographic process which uses a mask to define a first channel opening (not shown) in the first channel oxide layer. The first channel opening 101 is then filled with the thin adhesion layer 121, the thin barrier layer 122, and the first conductive material, such as copper, to form the first channel 101 using conventional metal deposition technique, such as physical vapor deposition, chemical vapor deposition, electroplating, or a combination thereof. The top surface would then be subject to chemical-mechanical polishing (CMP).

For the second channel 102, the stop nitride layer 114, the via oxide layer 116, and the via nitride layer 117 would be successively deposited on top of the first channel 101 and the first channel oxide layer using conventional deposition techniques.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 102 to be perpendicular to the first channel 101.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the first channel 101 and completes the etching steps. The second channel opening 106 is then filled with the thin adhesion layer 123, the thin barrier layer 124, and the second conductive material. The second conductive material is also a conductor, such as copper, to form the second channel 102 using conventional metal deposition technique, such as physical vapor deposition, chemical vapor deposition, electroplating, or a combination thereof A CMP process is used to level the second channel 102 to form the structure shown in FIG. 1B.

Next, the second conductive material is deposited into second channel opening 106 and cylindrical via opening 118 using conventional metal deposition technique, such as physical vapor deposition, chemical vapor deposition, electroplating, or a combination thereof Thereafter, a chemical-mechanical polishing process is used to complete the conventional process similar to what is shown in FIGS. 1A and 1B.

In production with the present invention, the steps are the same through the first damascene process to the formation of the channel opening in the dielectric 202 and the stop nitride layer 204. At this point, the alloy 210, shown in FIG. 3, will begin deposition. The alloy will preferably be between 50%–99% tantalum and 50%–1% titanium. It can be deposited by a number of different metal deposition techniques, such as physical vapor deposition, ion implantation, or sputtering. Generally, a TaTi alloy target having a 45 composition within the range described above will be used.

Since the Ti in the Ta—Ti alloy attaches exceedingly well with the oxide dielectric, this will lead to superb adhesion of the barrier layer 206 with the first channel oxide layer 202 and the oxide dielectric layer 112.

After deposition of the Ta—Ti alloy to a certain minimum thickness as a dielectric adhesion layer, nitrogen can be introduced into the sputtering process to cause the deposition of the barrier region 212, which would be $Ta_xTi_yN_z$ where x, y, an z are the proportion of elements which varies through the alloy, or compound. The addition of nitrogen to form the nitride of the alloy will enhance its barrier effectiveness to make it a superb copper diffusion barrier.

After deposition of the barrier region 212, the deposition of the alloy 210 will continue to form the alloy region 214. In the best mode, since Ti forms a phase with copper ($CuTi_3$), a strong bond is formed between the Ti and the copper interface between the alloy region 214 and the conductive material 216. This phase of $CuTi_3$ will also suppress copper interface diffusion of copper.

It should be noted that in the above process, the Ta—Ti deposition is continuous with the initial deposition starting in an inert gas atmosphere followed by the introduction of nitrogen for the nitriding process, with final replacement of the nitrogen with the inert gas. However, in some cases the nitrogen may contaminate, or "poison", the Ta—Ti target, and it may be desirable to stop the process while nitriding occurs by just heating the semiconductor wafer in a nitrogen atmosphere oven to cause the diffusion into the Ta—Ti surface area to form the nitride. Afterwards, the Ta—Ti deposition would continue to form a nitrideless region in order to form the bond with the copper conductive material. It should be noted that the barrier layer 206 could stop at the nitrided level if the conductive material is one which adheres will to the alloy nitride. Copper adheres better to the pure alloy.

After deposition of the barrier layer 206 to the desired thickness, the conductive material 216, or copper, would be deposited as shown in FIG. 6. After the copper deposition, the channel 101 would be subject to the chemical-mechanical polishing and the stop nitride 114 to provide the cross-section shown in FIG. 2.

With the stop nitride layer 114 in place, the second damascene process can be performed using the same forming process for the second or successive barrier layers.

The benefits of the present invention are multifold. First, the Ta in the Ta—Ti alloy attaches exceedingly well with the oxide providing superb adhesion with the barrier layer 206. Second, the Ta—Ti/ $Ta_xTi_yN_z$ /Ta—Ti deposition provides a sandwich in which the $Ta_xTi_yN_z$ acts as a superb copper diffusion barrier. Third, since the Ti forms a phase with the copper, the intermetallic interface between the Ta—Ti and copper is extremely strong and suppresses copper interface diffusion leading to a long electro-migration lifetime.

It should be understood that there are a number of other metals and alloys which could perform in a similar manner to that described above. For example, tungsten alloys and tungsten nitride are often used for barrier layers.

It should be further understood that the present invention is generally applicable to conductive materials such as doped polysilicon, copper, aluminum, gold, silver, their compounds, their alloys, and combinations thereof Further, although the embodiments of the present invention are directed to using the damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device, comprising:
   a semiconductor with a dielectric layer formed thereon, wherein said dielectric layer overlays a region on said semiconductor and has a channel provided therein;
   a barrier layer in said channel in said dielectric layer having first and second alloy portions with tantalum titanium nitride between said first and second alloy portions, said first and second alloy portions made of an alloy of tantalum and titanium; and
   a conductive layer over said barrier layer wherein the tantalum of tie alloy of tantalum and titanium bonds with said dielectric layer, the tantalum titanium nitride acts as a barrier to diffusion of said conductive layer, and the titanium of the alloy of tantalum and titanium bonds to said conductive layer.

2. The semiconductor device as claimed in claim 1 wherein the titanium forms from one percent to fifty percent of said alloy.

3. The semiconductor device as claimed in claim 1 wherein the tantalum forms from fifty percent to ninety-nine percent of said alloy.

4. The semiconductor device as claimed in claim 1 wherein said layer of conductive material is a material selected from a group consisting of copper, aluminum, gold, silver, a compound thereof, an alloy thereof and a combination thereof.

* * * * *